United States Patent
Kaehs

(10) Patent No.: US 7,902,836 B2
(45) Date of Patent: Mar. 8, 2011

(54) CALIBRATION DEVICE AND CALIBRATION METHOD FOR ADJUSTING A DIRECTIONAL-COUPLER MEASURING SYSTEM

(75) Inventor: Bernhard Kaehs, München (DE)

(73) Assignee: Rohde & Schwarz GmbH & Co. KG, München (DE)

( * ) Notice: Subject to any disclaimer, the term of this patent is extended or adjusted under 35 U.S.C. 154(b) by 614 days.

(21) Appl. No.: 11/909,982

(22) PCT Filed: Feb. 10, 2006

(86) PCT No.: PCT/EP2006/001241
§ 371 (c)(1),
(2), (4) Date: Dec. 6, 2007

(87) PCT Pub. No.: WO2006/111213
PCT Pub. Date: Oct. 26, 2006

(65) Prior Publication Data
US 2008/0252301 A1 Oct. 16, 2008

(30) Foreign Application Priority Data
Apr. 19, 2005 (DE) .......................... 10 2005 018 090

(51) Int. Cl.
*G01R 27/04* (2006.01)
*G01R 27/32* (2006.01)
*G01R 35/00* (2006.01)
(52) U.S. Cl. .......... 324/637; 324/639; 324/642; 324/601
(58) Field of Classification Search .................. 324/601, 324/637, 639, 642
See application file for complete search history.

(56) References Cited

U.S. PATENT DOCUMENTS

| 4,290,009 A | 9/1981 | Sanpei et al. |
| 5,471,146 A | 11/1995 | Krayeski et al. |
| 5,530,921 A * | 6/1996 | Dulong et al. ............... 455/120 |

FOREIGN PATENT DOCUMENTS

| DE | 691 24 762 | 10/1997 |
| DE | 693 22 509 | 5/1999 |
| DE | 693 24 916 | 10/1999 |
| DE | 692 30 756 | 7/2000 |
| EP | 0 479 168 | 4/1992 |
| EP | 0 715 177 | 6/1996 |
| WO | WO 99/21025 | 4/1999 |
| WO | WO 00/30272 | 5/2000 |
| WO | WO 02/054092 | 7/2002 |
| WO | WO 2005/010537 | 2/2005 |

* cited by examiner

*Primary Examiner* — Amy He
(74) *Attorney, Agent, or Firm* — Marshall, Gerstein & Borun LLP

(57) ABSTRACT

A calibration device for adjusting the forward power and reflected power measured via a single measuring directional coupler which is connected to a high-frequency transmitter, the forward power that is attenuated with $a_k+x$ and decoupled being used as a reference value. The calibration device comprises a changeover switch that is embodied as a double switch and is connected to the control and display unit via a control wire. A control signal that actuates the changeover switch is transmitted by the control and display unit, whereby switching occurs from a measurement of the reflected power to a measurement of the forward power. The forward power and the reflected power are measured via the same measuring directional coupler and by means of the same measuring sensor which is composed of a low pass and a rectifier.

14 Claims, 2 Drawing Sheets ent-title">CALIBRATION DEVICE AND CALIBRATION METHOD FOR ADJUSTING A DIRECTIONAL-COUPLER MEASURING SYSTEM

BACKGROUND OF THE INVENTION

1. Field of the Invention

The invention relates to a calibration device and a calibration method for adjusting a directional-coupler measuring system connected to a high-frequency transmission device.

2. Related Technology

A device, with which both the voltage of the forward wave and also the voltage of the reflected wave on a high-frequency line are measured and qualitatively evaluated by means of a directional coupler, wherein an alarm is triggered if a previously-specified threshold value is exceeded, is known from WO 02/054092 A1. The disadvantage of the device described in the document named above is that a corrected and adjusted display, which displays the measured value of the two voltages to the user of the device with adequate accuracy, is not provided. Moreover, the forward wave and the reflected wave are measured via separate sensors, thereby impairing the accuracy of the comparison measurement, because of the different tolerances of the two detectors used.

SUMMARY OF THE INVENTION

The invention therefore provides a calibration device and a calibration method for adjusting a directional-coupler measuring system connected to a high-frequency transmission device, wherein both the measurement and also the calibration and the adjustment of the directional-coupler measuring system are implemented with only one directional coupler to provide a corrected display of the measured value of the reflected power reflected in the high-frequency transmission device.

The inventive calibration device comprises a test sensor and a connected control and display unit for adjusting a forward power and a reflected power measured in a high-frequency transmission device via a single directional coupler. In this context, the measurement is preceded by the adjustment of the forward power, which is known with sufficient accuracy and transported on a transmission line of the high-frequency transmission device to an antenna, wherein the reference value for the adjustment is the emitted forward power of the high-frequency transition device, which is known with a sufficient accuracy. The calibration device according to the invention provides a changeover switch, which is connected via a control line to the control and display unit, wherein a control signal activating the changeover switch is transmitted from the control and display unit, thereby switching back from a measurement of the reflected power to a measurement of the forward power by means of the same measuring sensor, wherein the measurement of the forward power and the measurement of the reflected power are implemented via the same directional coupler.

BRIEF DESCRIPTION OF THE DRAWINGS

The invention is described in greater detail below with reference to the drawings. The drawings are as follows.

DETAILED DESCRIPTION

By way of explanation of the measures according to the invention, the prior art will first be explained with reference to FIG. 1, wherein components, which are components of the measuring system according to the prior art and also components of the calibration device according to the invention or respectively of the calibration method according to the invention, are marked with the same reference numbers.

Figure 1:
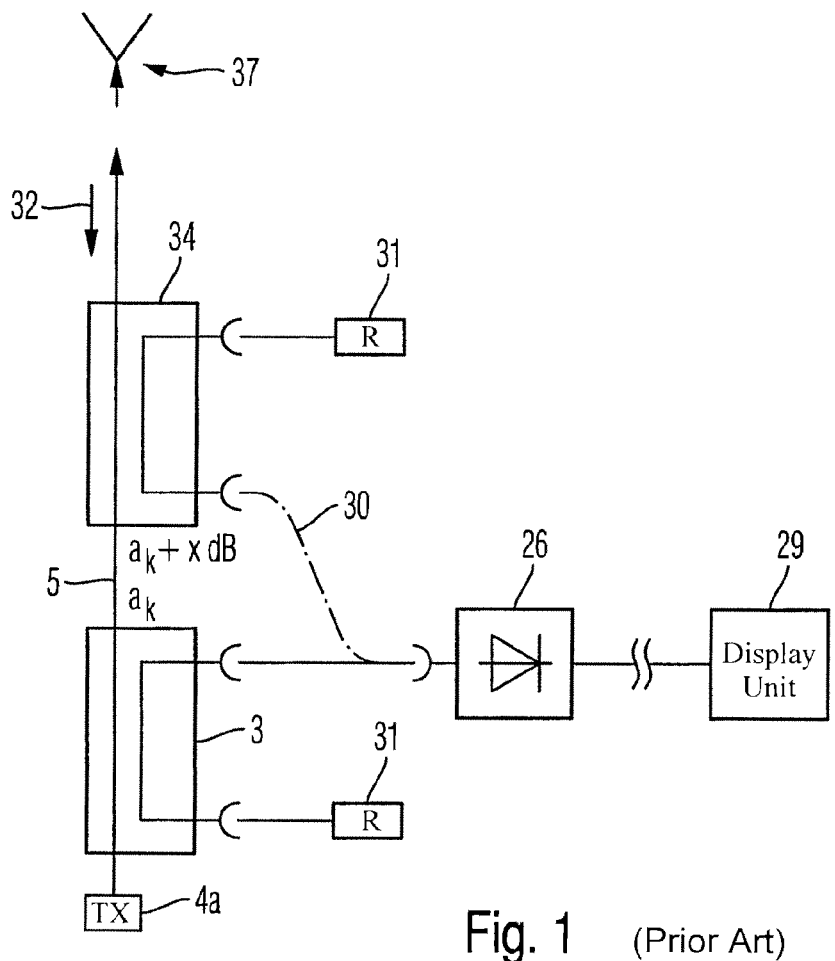
FIG. 1 shows a circuit diagram for a measuring system according to the prior art for adjusting the measured forward and reflected power and for subsequent, optional measurement of the forward power or the reflected power within a transmission system.

FIG. 1 shows a measuring system according to the prior art for adjusting the measured forward power and reflected power and for the subsequent, optional measurement of the forward or reflected power in a transmission system 4a. The forward power 6 corresponds to the transmission power emitted by the transmission system 4a, which the transmission system 4a transmits to the connected antenna 37. The reflected power 32 corresponds to the power, which is reflected from the antenna 37 on the transmission line 5 of the transmission system 4a, wherein this reflected power is transmitted towards the transmission system 4a, and the reflected power is transported in the opposite direction to the forward power 6.

In the context of measurement technology, the power reflected on a transmission line 5, that is to say, the reflected power 32, must be determined with a given accuracy, because it can destroy individual components of the transmission system 4a or the entire transmission system 4a itself. Accordingly, if a previously-specified threshold value is exceeded, an alarm or a cut-out mechanism, which protects the transmission system 4a from damage resulting from a high absorption of reflected power, will be activated.

A directional coupler 3 provided in the measuring system according to the prior art, of which the coupler attenuation is $a_k$ (in dB), decouples a component of the forward power 6 reduced by a predetermined factor, which corresponds to $a_k$ (in dB), and supplies this decoupled component of the forward power 6 to a rectifier 26, which converts this forward power 6 reduced by the predetermined factor into a direct-voltage signal. This direct-voltage signal is an input parameter for a display unit 29. In the display unit 29, the allocation of an analog direct-voltage signal present at the input to a discrete, digital measured value is implemented by means of an analog/digital converter. The digital measured value allocated to the direct-voltage signal is displayed by the display unit 29.

The measuring system must be calibrated and adjusted so that the discrete, digital measured value of the forward power 6 can be displayed with high precision by the display unit 29. This means that a measured value to be displayed is established for a known input value. The calibration and the adjustment of the measuring system are relatively simple for the forward power 6 to be measured. In this context, the forward power 6 corresponds to the output power of the transmission system 4a, which can either be determined very accurately or is given by a rated value, which provides a known tolerance. The display must simply be adjusted for a definite power and with a known accuracy to the rated value of the forward power 6. This can be implemented by means of a potentiometer, which is not further illustrated, or in the display unit 29 using a process-controlled algorithm.

A calibration and adjustment of the measuring system 4a for an accurate display of the reflected power 32 is more complex, because the value of the reflected power 32 under operating conditions is very much smaller than the forward power 6 and is generally unknown. For this purpose, an already-known reference value is used, wherein, in the prior art, as indicated in FIG. 1, it is necessary to re-plug a coaxial cable 30 into a reference directional coupler 34, and the measuring system is adjusted. As a result, the measuring range becomes more sensitive, that is to say, smaller measured values can be displayed with greater accuracy.

The first step in order to calibrate and adjust the measuring system so that the display unit 29 provides an accurate display of the measured, reflected power 32, is that a portion of the reflected power 32 reduced by the coupler attenuation $a_k$ (in dB) is supplied from the directional coupler 3 to the rectifier 26, which is used as a detector. A second output of the directional coupler 3 is terminated with a terminating resistance 31, in order to guarantee a good sharpness of directivity of the directional coupler 3. Since only the forward power 6 of the transmission system 4a is accurately known, for the calibration and adjustment of the measuring system, the input of the rectifier 26 is connected by means of the coaxial cable 30 to a forward output of a second directional coupler, which is provided in the measuring system as a reference directional coupler 34, in order to achieve an accurate display of the reflected power 32 in the display unit 29.

In this context, a known reference value, which corresponds to the forward power 6 attenuated by $a_k$+x (in dB), is generated. The reference value is derived from the forward power 6 reduced by the coupler attenuation $a_k$+x (in dB), wherein, for the calibration, the coupler attenuation for attenuating the forward power 6 provided as the reference value is adjusted to be higher by a value x (in dB) than for the actual measurement of the reflected power 32. This means that the reference value is more strongly attenuated, in order not to overload the rectifier 26 during the calibration and adjustment of the measuring system to provide a correct display of the registered measured value of the reflected power 32 with the forward power 6 as reference value.

The output of the directional coupler 3 is accordingly more sensitive for the measurement of the reflected power 32, and a power value is displayed, which is raised relative to the reference directional coupler 34 by a factor, which corresponds to x (in dB). The power displayed in the display unit 29 must therefore be scaled down by a factor, which corresponds to x (in dB). In the prior art, the calibration and adjustment is implemented, as shown in FIG. 1, manually by re-plugging a coaxial cable 30 into the reference directional coupler 34 and by subsequent fine-tuning of the power display, for example, by means of a potentiometer on the rectifier 26, which is not illustrated in greater detail, or by using a processor-controlled algorithm in the display unit 29.

The calibration and adjustment process includes connecting the reference directional coupler 34, of which the attenuation is increased by a known factor, which corresponds to x (in dB), via the rectifier 26 to the display unit 29, before measuring the reflected power 32. Since the factor x (in dB) is known, the display must be scaled down by this factor for the measurement of the reflected power 32. After this step has been implemented, the measuring system is prepared to display the reflected power 32, which is very much smaller than the forward power 6 under typical operating conditions, in the display unit 29, of which the measuring range is adjusted for a precise measurement of relatively smaller power values. For this purpose the coaxial cable 30 must be re-plugged into the first directional coupler 3 with the relatively lower attenuation.

Figure 2:
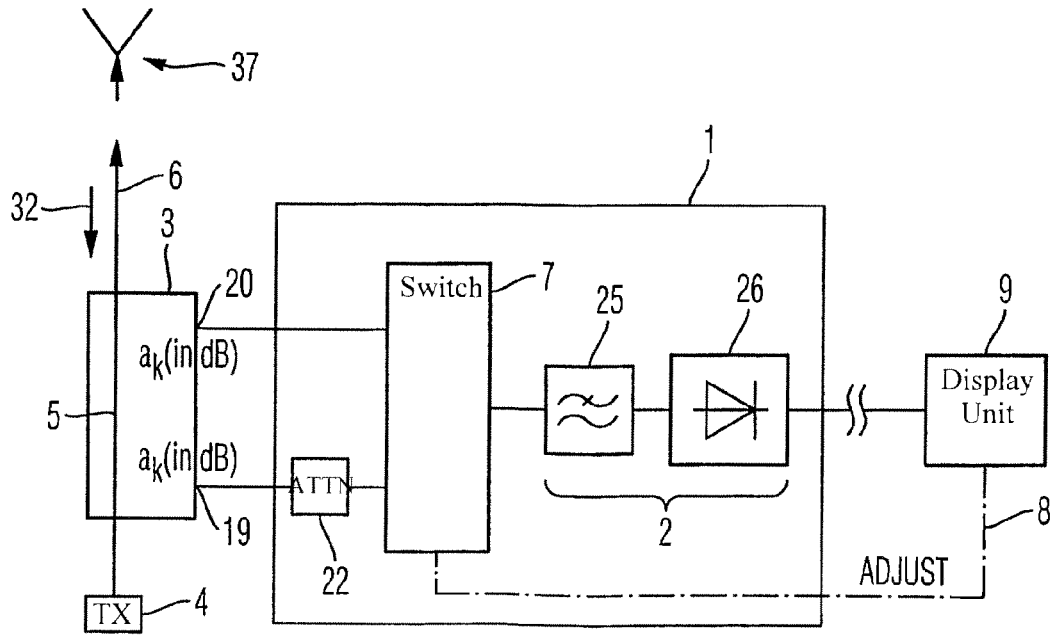
FIG. 2 shows a simplified circuit diagram of a calibration device according to the invention for adjusting a forward power and a reflected power measured in a high-frequency transmission device by means of a single directional coupler.

FIG. 2 shows a simplified circuit diagram of a calibration device 1 according to the invention for the adjustment and measurement of a forward power 6 and a reflected power 32 via a single directional coupler 3, which is connected to a high-frequency transmission device 4, wherein a control and display unit 9 displays the reflected power 32 reflected from an antenna 37 on a transmission line 5 of the high-frequency transmission device 4. In this context, the reference value for the calibration and adjustment process is also the known forward power 6 of the high-frequency transmission device 4.

The calibration device 1 according to the invention provides a changeover switch 7, which is connected via a control line 8 to the control and display unit 9. The control and display unit 9, which is preferably disposed at a distance from the measuring sensor 2 of the calibration device 1 according to the invention, generates a control signal activating the changeover switch 7 and transfers this signal to the control line 8. In this context, the system switches from a measurement of the reflected power 32 to the measurement of the forward power 6, wherein the measurement of the known and attenuated forward power 6 corresponds to the calibration measurement, and the measurement of the forward power 6 and the reflected power 32 is implemented via one and the same directional coupler 3. The control signal activating the changeover switch 7 is an "ADJUST" signal, which is stored in the command store of the separate control and display unit 9, generated by the latter in the case of a given event and transferred to the control line 8 leading to the changeover switch 7, so that during an active condition of the "ADJUST" signal, the changeover switch is disposed in the calibration position for measuring the forward power 6 and the reflected power 32, and the measurement of the forward power 6 is then implemented.

Figure 3:
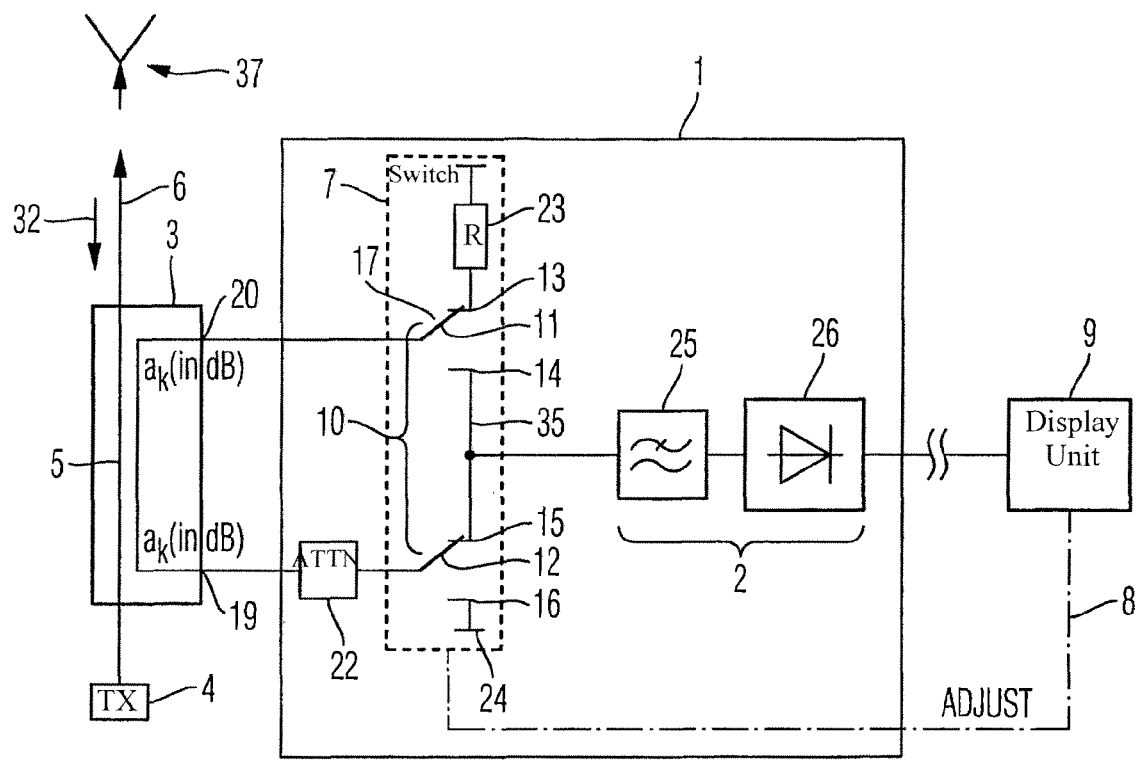
FIG. 3 shows a detailed circuit diagram of a first switching condition of a calibration device according to the invention for adjusting the forward power and reflected power measured in a high-frequency transmission device by means of a single directional coupler.

FIG. 3 shows a more detailed circuit diagram of the first switching condition 17 of a calibration device 1 according to the invention for adjusting the forward power 6 and reflected power 32 measured by means of a single directional coupler, wherein the changeover switch 7 in particular is illustrated in greater detail. The changeover switch, which in the exemplary embodiment is a double-action switch 10 with a first switch 11 and a second switch 12 comprising respectively a first contact position 13, 15 and a second contact position 14, 16, optionally provides a first switching condition 17 or a second switching condition 18, wherein the upper switch 11 and lower switch 12 are connected either to the upper contact position 13 terminated with a terminating resistance 23 of the first switch 11 and to the upper contact position 15 of the second switch 12, or to the lower contact position 14 of the first switch 11 and to the lower contact position 16 connected to the earth 24 of the second switch 12.

The first switching condition 17 is specified in that the first switch 11 and the second switch 12 simultaneously contact the first contact positions 13, 15 of the double-action switch 10.

Figure 4:
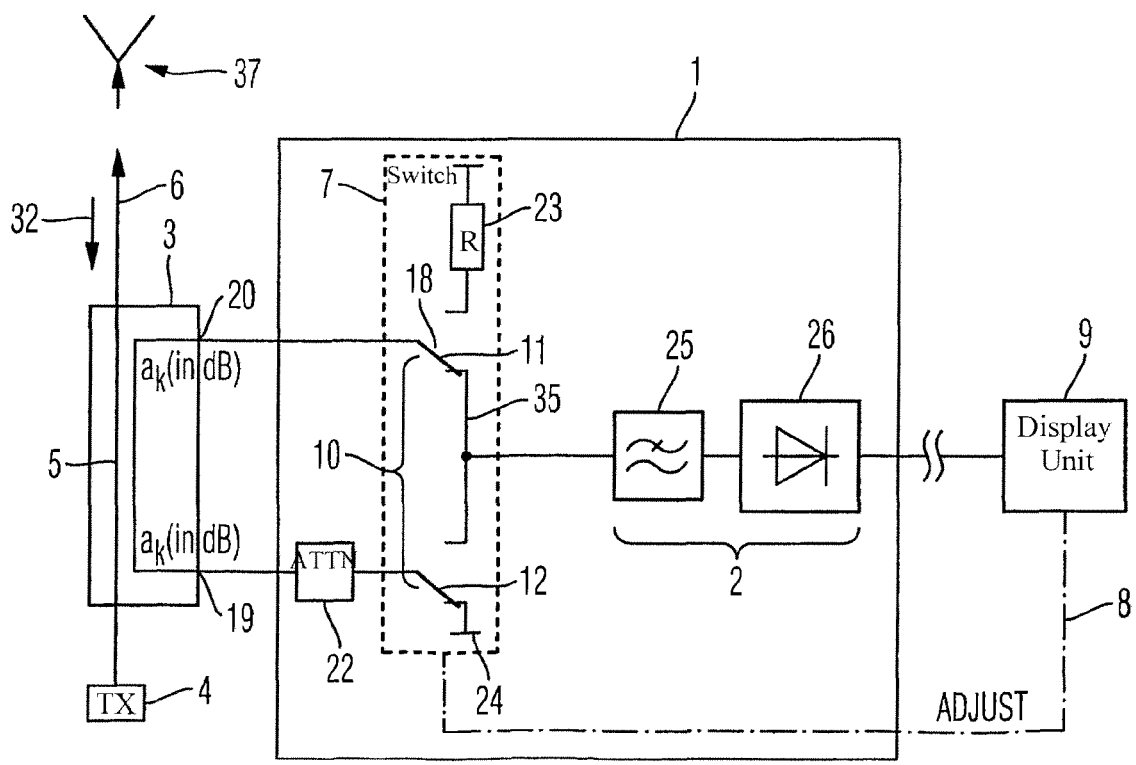
FIG. 4 shows a detailed circuit diagram of a second switching condition of a calibration device according to the invention for adjusting the forward power and reflected power measured in a high-frequency transmission device by means of a single directional coupler.

The second switching condition 18 shown in FIG. 4 is specified in that the first switch 11 and the second switch 12 simultaneously contact the second contact positions 14, 16 of the double-action switch. If the first switching condition 17 is present, the measured value for the forward power 6 is displayed in the separate control and display unit 9 after the adjustment by means of the attenuated, decoupled forward power 6. If the second switching condition 18 is present, the separate control and display unit 9 displays the reflected power 32, after the separate control and display unit 9 has been corrected using the known forward power 6, and after its measurement range has been expanded in such a manner that low power values, such as the reflected power 32, can also be displayed with sufficient accuracy.

A series circuit of a low-pass filter 25 and a rectifier 26 acting as a test sensor 2 is provided in the calibration device 1 according to the invention. The changeover switch 7 is connected upstream of the low-pass filter 25. On one side, the changeover switch 7 provides a serial connection to the directional coupler 3; on the other side, it is connected to the test sensor 2 comprising the low-pass filter 25 and the rectifier 26. The low-pass filter 25 provides a frequency response, which is approximately complementary in the fundamental frequency range to the frequency response of the directional coupler 3. The directional coupler 3 provides a first coupler output 19 for decoupling the forward power 6 and a second coupler output 20 for decoupling the reflected power 32, wherein the forward power 6 or respectively reflected power 32 decoupled from the first and the second coupler output 19, 20 is subjected respectively to the same specified coupler attenuation of $a_k$ (in dB).

The first coupler output 19 of the directional coupler 3 is connected, via an attenuation element 22 providing a specified attenuation factor x (in dB), to the second switch 12 of the double-action switch 10, and the second coupler output 20 of the directional coupler 3 is connected directly to the first switch 11 of the double-action switch 10, wherein the attenuation element 22, which connects the first coupler output 19 to the second switch 12, preferably provides an adapted input resistance of, for example, 50 ohms.

The wiring in the changeover switch 7 of the calibration device 1 according to the invention is implemented in such a manner that the second contact position 14 of the first switch 11 is connected to the first contact position 15 of the second switch 12 via a connecting line 35, which is connected to the low-pass filter 25 of the test sensor 2. In this context, in the first switching condition 17, a connection of the connecting line 35 to the first coupler output 19 of the directional coupler 3 is provided via the attenuation element 22, and, in the second switching condition 18, a connection of the connecting line 35 to the second coupler output 20 of the directional coupler 3 is provided, wherein the "ADJUST" signal, generated by the control and display unit 9 and transmitted via the control line 8 to the changeover switch 7 in the presence of an active condition, switches from the second switching condition 18 into the first switching condition 17, and thereby causes the forward power 6 to be displayed in the control and display unit 9 in the presence of the first switching condition 17.

FIG. 4 shows a more detailed circuit diagram of a second switching condition 18 of a calibration device 1 according to the invention for the calibration of a forward power 6 and reflected power 32 in a high-frequency transmission device 4 by means of a single directional coupler 3. The changeover switch 7, which is designed as a double-action switch 10 with a first switch 11 and a second switch 12 and comprising respectively a first contact position 13, 15 and a second contact position 14, 16, generates optionally a first switching condition 17 or a second switching condition 18, wherein the first switch 11 and the second switch 12 are connected simultaneously either to the first contact position 13 of the first switch 11 terminated with a terminating resistance 23 and to the second contact position 15 of the second switch 12, or to the second contact position 14 of the first switch 11 and to the second contact position 16 connected to the earth 24 of the second switch 12.

The second switching condition 18, as shown in FIG. 4, is specified in that the first switch 11 and the second switch 12 simultaneously contact the second contact positions 14, 16. If the second switching condition 18 is present, as shown in FIG. 4, the separate control and display unit 9 can measure and display the reflected power 32 transported on the transmission line 5.

The wiring in the changeover switch 7 of the calibration device 1 according to the invention is implemented in such a manner that the second contact position 14 of the first switch 11 is connected to the first contact position 15 of the second switch 12 via a connecting line 35, which is connected to the low-pass filter 25 of the test sensor 2. In this context, with the second switching condition 18 as shown in FIG. 4, a connection of the connecting line 35 to the second coupler output 20 of the directional coupler 3 is provided, wherein the "ADJUST" signal, generated by the control and display unit 9 and transmitted via the control line 8 to the changeover switch 7 in the active condition, specifies the first switching condition 17, which is defined via a connection of the test sensor 2 to the first coupler output 19 of the directional coupler 3.

The calibration method according to the invention for adjusting the forward power 6 and reflected power 32 measured in a high-frequency transmission device 4 by means of a calibration device 1, which provides only a single directional coupler 3, only one test sensor 2 and is connected to a control and display unit 9, comprises several steps.

In the first step, the control signal transported via the control line 8 activates a changeover switch 7 provided in the calibration device 1 according to the invention, thereby switching from a measurement of the reflected power 32 to a measurement of the forward power 6. The measurement of the forward power 6 is implemented via the same directional coupler 3 provided in the calibration device 1 according to the invention and the same test sensor 2, and is displayed by the control and display unit 9, after this has displayed the measured value of the forward power 6 adjusted by a reference value. In this context, the control and display unit 9 can be disposed at a distance from the calibration device 1.

The active condition of the control command "ADJUST" is interpreted in the calibration device 1 according to the invention in such a manner that it throws the changeover switch 7 and accordingly switches from a measurement of the reflected power 32 to a measurement of the forward power 6. The changeover switch 7 in the exemplary embodiment is designed as a double-action switch 10 with a first switch 11 and a second switch 12, wherein the first switch 11 and the second switch 12 are switched simultaneously either to a first contact position 13, 15 or to a second contact position 14, 16. The first switching condition 17 or the second switching condition 18 are generated optionally by means of the double-action switch 10, wherein, in the presence of the first switching condition 17, the calibration device 1 calibrates the directional coupler 3 with the forward power 6 transported on the transmission line 5 as the reference value.

In the first switching condition 17, the directional coupler 3 is calibrated by means of the calibration device 1 with the decoupled and attenuated forward power 6. The first switching condition 17 occurs, after the control command "ADJUST" provided for this purpose has been generated by the control and display unit 9, switched into the active condition and transmitted to the calibration device 1 according to the invention, where it is interpreted. The method according to the invention comprises in the given sequence a wiring of a directional coupler 3 provided with two coupler outputs 19, 20, a changeover switch 7 and a test sensor 2, wherein the test sensor 2 consists of a low-pass filter 25 and a rectifier 26. In this context, the directional coupler 3 is dimensioned in such a manner that the forward power 6 or the reflected power 32 is optionally decoupled with a specified coupler attenuation of $a_k$ (in dB) independent of the frequency response. In this context, the low-pass filter 25 is used to compensate the frequency response of the directional coupler 3, which shows high-pass behaviour. The first coupler output 19 of the directional coupler 3 is connected, via an attenuation element 22 with a defined attenuation x (in dB), to the second switch 12 of the double-action switch 10, and the second coupler output 20 of the directional coupler 3 is connected directly to the first switch 11 of the double-action switch 10.

The invention is not restricted to the exemplary embodiment presented and described. All the elements described can be combined with one another as required. As a result of the changeover switch 7 provided according to the invention, the provision of two detectors, one for the measurement of the forward power 6 and one for the measurement of the reflected power 32, as required in the prior art, is no longer necessary. A single test sensor 2 consisting of a single low-pass filter 25 and a single rectifier 26 or respectively diode detector can be used. Accordingly, not only is the cost of the calibration device 1 reduced; the accuracy of measurement is also increased, because the measurement of the forward power 6 and the reflected power 32 is implemented via the same test sensor 2, the same low-pass filter 25 and the same analog/digital converter, so that any measurement or calibration inaccuracies have an identical effect on the measurement of the forward power 6 and the measurement of the reflected power 32 and are therefore mutually compensating. In this context, only a single adjustment of the forward power 6 is required both for the measurement of the forward power 6 and also for the measurement of the reflected power 32. The display in the measurement of the reflected power 32 is simply calculated down by the value of the attenuation element 22.

The invention claimed is:

1. Calibration device comprising a test sensor and a connected control and display unit for adjusting forward power and reflected power measured in a high-frequency transmission device via a single directional coupler,
    wherein the adjustment is implemented with reference to known forward power transmitted on a transmission line from the high-frequency transmission device to an antenna,
    wherein the calibration device further comprises a changeover switch which is connected via a control line to the control and display unit wherein a control signal activating the changeover switch is transmitted from the control and display unit, thereby switching from a measurement of the reflected power to a measurement of the forward power by the same test sensor,
    wherein the measurement of the forward power and the measurement of the reflected power are implemented via the same directional coupler,
    wherein the changeover switch is a double-action switch, which provides a first switch and a second switch respectively with a first contact position and a second contact position, wherein the first switch and the second switch are connected at the same time optionally in a first switching condition either to the respective, first contact position or in a second switching condition to the respective, second contact position of the corresponding switch,
    wherein the directional coupler provides a first coupler output for decoupling the forward power and a second coupler output for decoupling the reflected power,
    wherein the first coupler output of the directional coupler is connected via an attenuation element to the second switch of the changeover switch designed as a double-action switch, and the second coupler output of the directional coupler is connected directly to the first switch of the changeover switch designed as a double-action switch, and
    wherein the attenuation element connected to the first coupler output of the directional coupler provides a fixed, specified attenuation factor of x.

2. Calibration device according to claim 1, wherein the control and display unit is disposed separately and at a distance from the test sensor.

3. Calibration device according to claim 1, wherein the control signal activating the changeover switch is generated in the control and display unit.

4. Calibration device according to claim 1, wherein in the first switching condition, after the adjustment of the forward power transported on the transmission line of the high-frequency transmission device, the forward power is measured as a reference value.

5. Calibration device according to claim 1, wherein in the second switching condition, after the adjustment by means of the forward power transported on the transmission line of the high-frequency transmission device as a reference value, the measurement of the reflected power, transported on the transmission line of the high-frequency transmission device and reflected from the antenna, is implemented.

6. Calibration device according to claim 1, further comprising
    a low-pass filter and a rectifier as a test sensor, and wherein the changeover switch disposed upstream of the low-pass filter connects the test sensor optionally to one of the two coupler outputs of the directional coupler, wherein the low-pass filter has a frequency response, which is approximately complementary to the frequency response of the directional coupler in the fundamental frequency range.

7. Calibration device according to claim 1, wherein the directional coupler provides the same coupling attenuation $a_k$ at the first coupler output and at the second coupler output.

8. Calibration device according to claim 1, wherein the first contact position of the first switch is terminated with a terminating resistance.

9. Calibration device according to claim 1, wherein the second contact position of the second switch is connected directly or via a terminating resistance to earth.

10. Calibration device according to claim 1, wherein the second contact position of the first switch is connected to the first contact position of the second switch via a connecting line.

11. Calibration device according to claim 10, wherein the connecting line is connected to the low-pass filter of the test sensor.

12. Calibration device according to claim 1, wherein the first switching condition establishes a connection of the test sensor to the first coupler output of the directional coupler.

13. Calibration device according to claim 1, wherein the second switching condition establishes a connection of the test sensor to a second coupler output of the directional coupler.

14. Calibration method with a calibration device for the adjustment of a forward power and reflected power measured in a control and display unit connected to a high-frequency transmission device, wherein the adjustment is implemented with regard to the forward power transmitted on a transmission line of the high-frequency transmission device to an antenna, and the reference value for the adjustment is the known forward power of the high-frequency transmission device, and wherein a control line connects the calibration device to the control and display unit, the method comprising the steps of:

the control and display unit generating a control signal, the control signal transmitted via the control line activating a changeover switch provided in the calibration device, the changeover switch being a double-action switch providing a first switch and a second switch respectively with a first contact position and a second contact position, thereby switching from a measurement of the forward power to a measurement of the reflected power wherein the measurement of the reflected power and the measurement of the forward power are implemented via the same directional coupler provided in the calibration device and the same test sensor, wherein the directional coupler provides a first coupler output and a second coupler output, and wherein the first coupler output of the directional coupler is connected via an attenuation element to the second switch of the changeover switch designed as a double-action switch, and the second coupler output of the directional coupler is connected directly to the first switch of the changeover switch designed as a double-action switch, connecting the first switch and the second switch at the same time optionally in a first switching condition either to the respective, first contact position or in a second switching condition to the respective, second contact position of the corresponding switch, the first coupler output decoupling the forward power, the second coupler output decoupling the reflected power, and the attenuation element providing a fixed, specified attenuation factor of x.

* * * * *